(12) United States Patent
Lee et al.

(10) Patent No.: US 9,184,319 B2
(45) Date of Patent: Nov. 10, 2015

(54) MULTI-TERMINAL MULTI-JUNCTION PHOTOVOLTAIC CELLS

(75) Inventors: Jung-Yong Lee, Daejeon (KR); Peter Peumans, Leuven (BE)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 795 days.

(21) Appl. No.: 13/350,134

(22) Filed: Jan. 13, 2012

(65) Prior Publication Data

US 2012/0298170 A1    Nov. 29, 2012

Related U.S. Application Data

(60) Provisional application No. 61/433,045, filed on Jan. 14, 2011.

(51) Int. Cl.
| | | |
|---|---|---|
| *H01L 21/326* | (2006.01) | |
| *H01L 31/0224* | (2006.01) | |
| *H01L 51/44* | (2006.01) | |
| *H01L 27/30* | (2006.01) | |
| *H01L 51/42* | (2006.01) | |

(52) U.S. Cl.
CPC ...... *H01L 31/022466* (2013.01); *H01L 27/302* (2013.01); *H01L 51/442* (2013.01); *H01L 51/424* (2013.01); *H01L 51/4253* (2013.01); *Y02E 10/549* (2013.01); *Y10T 428/31678* (2015.04)

(58) Field of Classification Search
CPC . H01L 25/047; H01L 27/304; H01L 31/0488; H01L 25/045; H01L 27/1422; H01L 27/1426; H01L 27/1428; H01L 31/02008; H01L 31/02021; H01L 31/02167; H01L 31/022425
See application file for complete search history.

(56) References Cited

U.S. PATENT DOCUMENTS

| | | | |
|---|---|---|---|
| 4,658,086 | A | 4/1987 | McLeod et al. |
| 7,294,417 | B2 | 11/2007 | Ren et al. |
| 7,655,860 | B2 | 2/2010 | Parsons |
| 7,704,479 | B2 | 4/2010 | Rinzler et al. |
| 2007/0025139 | A1 | 2/2007 | Parsons |
| 2008/0006319 | A1 | 1/2008 | Bettge et al. |
| 2008/0108171 | A1 | 5/2008 | Rogers et al. |
| 2008/0178924 | A1 | 7/2008 | Kempa et al. |
| 2009/0007956 | A1 | 1/2009 | Kempa et al. |

(Continued)

OTHER PUBLICATIONS

Pettersson, L. A. A.; Roman, L. S. and Inganas, O., "Modeling Photocurrent Action Spectra of Photovoltaic Devices Based on Organic Thin Films", *Journal of Applied Physics*, vol. 86, (1), pp. 487-496, (1999).

(Continued)

*Primary Examiner* — David Vu
*Assistant Examiner* — Cuong Nguyen
(74) *Attorney, Agent, or Firm* — Crawford Maunu PLLC (57) ABSTRACT

Methods and apparatuses are provided in connection with a transparent electrode on organic photovoltaic cells. A layer of dissolvable material is formed on a substrate. A solution having conductive nanowires suspended therein is deposited on the layer of dissolvable material. The solution is evaporated to form a nanowire mesh. The nanowire mesh is heated to sinter junctions between nanowires in the nanowire mesh. The nanowire mesh is affixed on a layer of one or more organic photovoltaic cells. The layer of dissolvable material is dissolved to deposit the nanowire mesh on the layer of one or more organic photovoltaic cells.

17 Claims, 12 Drawing Sheets

(56) References Cited

U.S. PATENT DOCUMENTS

| | | |
|---|---|---|
| 2009/0253227 A1 | 10/2009 | Defries et al. |
| 2009/0283304 A1 | 11/2009 | Winoto |
| 2010/0112748 A1 | 5/2010 | Vidu et al. |
| 2010/0175748 A1 | 7/2010 | Karg |
| 2010/0197073 A1 | 8/2010 | Parsons |
| 2010/0212718 A1 | 8/2010 | Houghton |
| 2010/0301320 A1 | 12/2010 | Rand et al. |
| 2010/0319759 A1 | 12/2010 | Fisher et al. |
| 2011/0036395 A1 | 2/2011 | Argo et al. |

OTHER PUBLICATIONS

Ishii, H.; Sugiyama, K.; Ito, E. and Seki, K., "Energy Level Alignment and Interfacial Electronic Structures at Organic/Metal and Organic/Organic Interfaces", *Adv. Mater.*, vol. 11 (8), pp. 605-625, (1999).

Klauk, H.; Huang, J.-R.; Nichols, J. A. and Jackson, T. N., "Ion-Beam-Deposited Ultrathin Transparent Metal Contacts", *Thin Solid Films* 366 (1-2), pp. 272-278, (2000).

Brabec, C. J.; Sariciftci, N. S. and Hummelen, J. C., "Plastic Solar Cells", *Adv. Funct. Mater.*, vol. 11, pp. 15-26, (2001).

Brabec, C. J.; Winder, C.; Sariciftci, N. S.; Hummelen, J. C.; Dhanabalan, A.; van Hal, P. A. and Janssen, R. A., "A Low-Bandgap Semiconducting Polymer for Photovoltaic Devices and Infrared Emitting Diodes", *J. Advanced Functional Materials*, vol. 12, (10), pp. 709-712, (2002).

Peumans, P.; Yakimov, A. and Forrest, S. R., "Small Molecular Weight Organic Thin-Film Photodetectors and Solar Cells", *Journal of Applied Physics*, 93, (7), pp. 3693-3723 (2003).

Forrest, S. R., "The path to ubiquitous and low-cost organic electronic appliances on plastic", *Nature*, 428, pp. 911-918, (2004).

Wu, Z. et al., "Transparent, Conductive Carbon Nanotube Films", *Science*, 305, pp. 1273-1276, (2004).

Li, Y. Q.; Tang, J. X.; Xie, Z. Y.; Hung, L. S. and Lau, S. S., "An Efficient Organic Light-Emitting Diode With Silver Electrodes", *Chem. Phys. Lett.*, 386 (1-3), pp. 128-131, (2004).

Glatthaar, M.; Niggemann, M.; Zimmermann, B.; Lewer, P.; Riede, M.; Hinsch, A. and Luther, J., "Organic Solar Cells Using Inverted Layer Sequence", *Thin Solid Films*, 491, pp. 298-300, (2005).

Zhang, M. et al., "Strong, transparent, multifunctional, carbon nanotube sheets", *Science*, 309, pp. 1215-1219, (2005).

Pasiquier, A. D. et al. Conducting and Transparent Single-Wall Carbon Nanotube Electrodes for Polymer-Fullerene Solar Cells, *Appl. Phys. Lett.*, 87, 203511, (2005).

Li, G.; Shrotriya, V.; Yao, Y. and Yang, Y., "Investigation of Annealing Effects and Film Thickness Dependence of Polymer Solar Cells Based on Poly(3-hexylthiophene)", *J. Appl. Phys.*, 98, pp. 043704-043705, (2005).

Li, G.; Shrotriya, V.; Huang, J.; Yao, Y.; Moriarty, T.; Emery, K. and Yang, Y., "High-Efficiency Solution Processable Polymer Photovoltaic Cells by Self-Organization of Polymer Blends", *Nat. Mater.*, vol. 4, pp. 864-868, (2005).

Kumar, S.; Murthy, J. Y. and Alam, M. A., "Percolating conduction in finite nanotube networks", *Phys. Rev. Lett*, 95, 066802, (2005).

Du Pasquier, A.; Unalan, H. E.; Kanwal, A.; Miller, S. and Chhowalla, M., "Conducting and Transparent Single-Wall Carbon Nanotube Electrodes for Polymer-Fullerene Solar Cells", *Appl. Phys. Lett.*, 87, 203511-3, (2005).

Rowell, M. W.; Topinka, M. A.; McGehee, M. D.; Prall, H. J.; Dennler, G.; Sariciftı, N. S.; Hu, L. and Gruner, G., "Organic Solar Cells With Carbon Nanotube Network Electrodes", *Appl. Phys. Lett.*, 88, 233506-3, (2006).

Li, G.; Chu, C.-W.; Shrotriya, V.; Huang, J. and Yang, Y., "Efficient Inverted Polymer Solar Cells", *Appl. Phys. Lett.*, 88, 253503-3 (2006).

Kang, M.-G. and Guo, L. J., "Nanoimprinted Semitransparent Metal Electrodes and Their Application in Organic Light-Emitting Diodes", *Adv. Mater.*, 19, pp. 1391-1396, (2007).

Günes, S.; Neugebauer, H. and Sariciftci, N. S., "Conjugated Polymer-Based Organic Solar Cells", *Chem. Rev.*, 107, pp. 1324-1338, (2007).

Zhou, Y.; Zhang, F.; Tvingstedt, K.; Barrau, S.; Li, F.; Tian, W. and Inganas, O., "Investigation on Polymer Anode Design for Flexible Polymer Solar Cells", *Appl. Phys. Lett.*, 92 (23), 233308-3, (2008).

Hadipour, A.; de Boer, B. and Blom, P. W. M., "Organic Tandem and Multi-Junction Solar Cells", *Adv. Funct. Mater.*, 18 (2), pp. 169-181, (2008).

O'Connor, B.; Haughn, C.; An, K.-H.; Pipe, K. P. and Shtein, M., "Transparent and Conductive Electrodes Based on Unpatterned Thin Metal Films", *Appl. Phys. Lett.*, 93 (22), 223304-3, (2008).

Lee, J.Y., et al., "Solution•Processed Metal Nanowire Mesh Transparent Electrodes", *Nano Letters*, 8(2): pp. 689-692, (2008).

Liao, H.; Chen, L.; Xu, Z.; Li, G. and Yang, Y., "Highly Efficient Inverted Polymer Solar Cell by Low Temperature Annealing of Cs2CO3 Interlayer", *Appl. Phys. Lett.*, 92,173303-3, (2008).

Huang, J; Li, G. and Yang, Y., "A Semi-transparent Plastic Solar Cell Fabricated by a Lamination Process", *Adv. Mater.*, 20, pp. 415-419, (2008).

Kuwabara, T.; Nakayama, T.; Uozumi, K.; Yamaguchi, T. and Takahashi, K., "Highly Durable Inverted-Type Organic Solar Cell Using Amorphous Titanium Oxide as Electron Collection Electrode Inserted Between ITO and Organic Layer", *Sol. Energy Mater. Sol. C*, 92, pp. 1476-1482, (2008).

Steim, R.; Choulis, S. A.; Schilinsky, P. and Brabec, C. J., "Interface Modification for Highly Efficient Organic Photovoltaics", *Appl. Phys. Lett.*, 92,093303-3, (2008).

Eda, G.; Fanchini, G. and Chhowalla, M., "Large-Area Ultrathin Films of Reduced Graphene Oxide as a Transparent and Flexible Electronic Material", *Nat. Nanotechnol.*, 3, pp. 270-274, (2008).

Kim, J.; Khang, D. Y.; Kim, J. H. and Lee, H. H., "The Surface Engineering of Top Electrode in Inverted Polymer Bulk-Heterojunction Solar Cells", *Appl. Phys. Lett.*, 92, 133307-3, (2008).

Becerril, H. A.; Mao, J.; Liu, Z.; Stoltenberg, R. M.; Bao, Z. and Chen, Y., "Evaluation of Solution-Processed Reduced Graphene Oxide Films as Transparent Conductors", *ACS Nano*, 2, pp. 463-470, (2008).

Wang, X.; Zhi, L. and Müllen, K., "Transparent, Conductive Graphene Electrodes for Dye-Sensitized Solar Cells", *Nano Lett.*, 8, pp. 323-327, (2008).

Wu, J.; Becerril, H. A.; Bao, Z.; Liu, Z.; Chen, Y. and P. Peumans, "Organic Solar Cells with Solution-Processed Graphene Transparent Electrodes", *Appl. Phys. Lett.*, 92, 263302-3, (2008).

Meiss, J.; Allinger, N.; Riede, M. K. and Leo, K., "Improved Light Harvesting in Tin-Doped Indum Oxide (ITO)-Free Inverted Bulk-Heterojunction Organic Solar Cells Using Capping Layers", *Appl. Phys. Lett.*, 93, 103311-3, (2008).

Meiss, J.; Riede, M. K. and Leo, K., "Towards Efficient Tin-Doped Indium Oxide (ITO)-Free Inverted Organic Solar Cells Using Metal Cathodes", *Appl. Phys. Lett.*, 94 (1), No. 013303-3, (2009).

Meiss, J.; Riede, M. K. and Leo, K., "Optimizing the Morphology of Metal Multilayer Films for Indium Tin Oxide (ITO)-Free Inverted Organic Solar Cells", *J. Appl. Phys.*, 105 (6), No. 063108-5, (2009).

Tung, V. C.; Chen, L. M.; Allen, M. J.; Wassei, J. K.; Nelson, K.; Kraner, R. B. and Yang, Y., "Low-Temperature Solution Processing of Graphene-Carbon Nanotube Hybrid Materials for High-Performance Transparent Conductors", *Nano Lett.*, 9, pp. 1949-1955, (2009).

Sista, S.; Hong, Z. R.; Park, M. H.; Xu, Z. and Yang, Y., "High-Efficiency Polymer Tandem Solar Cells with Three-Terminal Structure", *Advanced Materials*, 22, (8), E77-E80, (2010).

Lee, J. Y.; Connor, S. T.; Cui, Y. and Peumans, P., "Semitransparent Organic Photovoltaic Cells with Laminated Top Electrode", *Nano Letters*, 10, (4), pp. 1276-1279, (2010).

Gaynor, W.; Lee, J. Y. and Peumans, P., "Fully Solution-Processed Inverted Polymer Solar Cells with Laminated Nanowire Electrodes", *Acs Nano*, 4, (1), pp. 30-34., (2010).

MULTI-TERMINAL MULTI-JUNCTION PHOTOVOLTAIC CELLS

RELATED DOCUMENTS

This patent document claims benefit under 35 U.S.C. §119 to U.S. Provisional Patent Application Ser. No. 61/433,045, entitled "Photovoltaic or Organic Solar Cells with (Multi-Terminal) Multi-Junction Architecture" and filed on Jan. 14, 2011; this patent document and the Appendices filed in the underlying provisional application, including the references cited therein, are fully incorporated herein by reference.

FEDERALLY-SPONSORED RESEARCH AND DEVELOPMENT

This invention was made with Government support under contract ECS-0507301 awarded by the National Science Foundation. The Government has certain rights in this invention.

FIELD

One or more embodiments generally relate to transparent conductive electrodes for organic photovoltaic cells.

BACKGROUND

Organic photovoltaic cells are considered a promising solar cell technology because of the configurability of electronic and optical properties of organic semiconductors and the potential for low-cost roll-to-roll manufacturing. However, the relatively low efficiency of organic solar cells is a major roadblock that stands in the way of commercialization.

Efficiencies of organic photovoltaic cells may be improved by stacking several individual cells having different optical gaps which are combined into a series-connected stack. The cells are tuned so some photons that have energy sufficient to pass through a first one of the stacked cells can be absorbed by other ones of the stacked cells. Conventionally, the stacked cells are electrically interconnected in series in the stack. As a result of the series connected arrangement, current passing through the cells is limited to the smallest current produced by one of the cells in the stack. Efficient cells that produce a lot of current are limited by inefficient cells that produce little current. To avoid this scenario, stacked cells are generally matched so the cells in a stack each produce approximately an equivalent current. Such matching can be time consuming and expensive.

Further, the manufacture of organic photovoltaic cells is complicated by current processes of fabricating conductive electrodes. Previous methods for depositing transparent conductive films on a photovoltaic cell to form an electrode involve high temperature, vacuum sputtering processes, and harsh chemicals, which can damage organic photovoltaic cells.

One or more embodiments may address one or more of the above issues.

SUMMARY

Certain aspects of the present disclosure are directed to apparatuses and methods that overcome the above-mentioned and other issues. Consistent therewith, specific apparatuses and methods involve a variety of fabrication methods to form transparent electrodes on organic photovoltaic cells.

In one embodiment, a transparent electrode is formed on organic photovoltaic cells as follows. A layer of dissolvable material is formed on a substrate, a solution having conductive nanowires suspended therein is deposited on the layer of dissolvable material, and the solution is evaporated to form a nanowire mesh. The nanowire mesh is heated to sinter junctions between nanowires in the nanowire mesh, and the nanowire mesh is affixed on a layer of one or more organic photovoltaic cells. The layer of dissolvable material is dissolved to deposit the nanowire mesh on the layer of one or more organic photovoltaic cells.

In some other embodiments, various intermediate structures are provided. In one embodiment, an intermediate structure, corresponding to an intermediate manufacturing stage, includes a layer of sacrificial material formed on a carrier substrate. A solution containing nanowires in suspension is deposited on the dissolvable material. In another embodiment, a second intermediate structure, corresponding to a later manufacturing stage, includes a mesh of silver (Ag) nanowires sintered together on the layer of one or more organic photovoltaic cells. The mesh is located between a layer of one or more organic photovoltaic cells and a sacrificial material layer is on the mesh of Ag nanowires. A carrier substrate is affixed to the sacrificial material layer.

Other embodiments are indicated by way of the examples described herein, and by way of the contemplated claims. The above summary is limited to characterizing certain aspects and is not intended to describe each illustrated embodiment or every implementation of the present disclosure. The figures and detailed description that follow, including that described in the appended claims, more particularly exemplify embodiments in support of the disclosure.

BRIEF DESCRIPTION OF THE DRAWINGS

The disclosure may be more completely understood in consideration of the detailed description of various embodiments of the disclosure that follows in connection with the accompanying drawings as follows.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

One or more embodiments provide various methods for depositing transparent conductive films, which may be used to form electrodes on organic photovoltaic cells without causing significant damage to the cell. For example, in one embodiment, a transparent conductive film including a nanowire mesh can be formed on a carrier substrate and transferred after formation to a target device (e.g., an organic photovoltaic cell). Other embodiments are directed to apparatuses and systems involving transparent conductive films, in accordance with the above.

Various embodiments are believed to be implementable with a number of different applications, which benefit from organic photovoltaic-type functionality or operation, such as in the context of devices that operate based on principles of photovoltaic and/or photoelectric effect, or otherwise utilize transparent conductive films. While the present disclosure is not necessarily limited, for ease of explanation, the embodiments and examples are primarily described with references to a multi junction multi-terminal photovoltaic cell, such as discussed below.

As may be implemented in connection with one or more embodiments, the efficiency of organic photovoltaic cells may be improved by stacking several individual ones of the cells, such as by arranging the stacked cells in a multi-terminal multi-junction architecture. The multi-junction multi-terminal architecture provides an electrode terminal between stacked ones of the photovoltaic cells, wherein the stacked cells are no longer limited to being electrically coupled in series. For example, the cells may be electrically coupled in parallel and a number of other electrical arrangements as required by a particular application. In this manner, the cells can be individually tapped to convert energy at higher currents and photocurrent matching can be avoided. This approach can be used to address challenges relating to current generation in series-connected stacked organic photovoltaic cells, as may be restricted to a smallest current produced by a least efficient one of the cells (e.g., as discussed above).

Multi junction multi-terminal photovoltaic cells, in accordance with one or more embodiments, involve at least two stacked cells with one or more electrodes in-between. In order for light to pass through a top one of the cells to a lower one of the cells, the electrode must be transparent (or at least partially transparent). Various embodiments herein are directed to the fabrication of transparent conductive films, in a manner that addresses challenges relating to high temperature, vacuum sputtering processes, and harsh chemicals, which can damage organic photovoltaic cells.

Using various embodiments to form transparent conductive electrodes, various devices having a multi junction photovoltaic cell arrangement may be fabricated. One or more embodiments provide a multi junction multi-terminal organic photovoltaic cell. In connection with these embodiments, while the photocurrent densities of different layers of cells can be significantly different (depending, e.g., on the particular embodiment and the related target end-use application), the overall power conversion efficiency is not necessarily limited by the cell that produces the smallest photocurrent.

In various embodiments, aspects of this disclosure are appreciated in the context of certain types of devices having a multi-terminal multi junction organic photovoltaic cell using a low-cost, high-performance metal nanowire mesh as intermediate electrode between the cells. The multi junction cell combines a polymer bulk heterojunction front cell and a small-molecule bilayer back cell. Although the photocurrent densities of the different layers of stacked cells can be significantly different (depending, e.g., on the embodiment and the related target end-use application), the overall power conversion efficiency is not necessarily limited by the cell that produces the smallest photocurrent. Simulations and experimental embodiments are presented herein to compare the efficiency potential of series-connected and multi-terminal multi junction cells.

Figure 1:
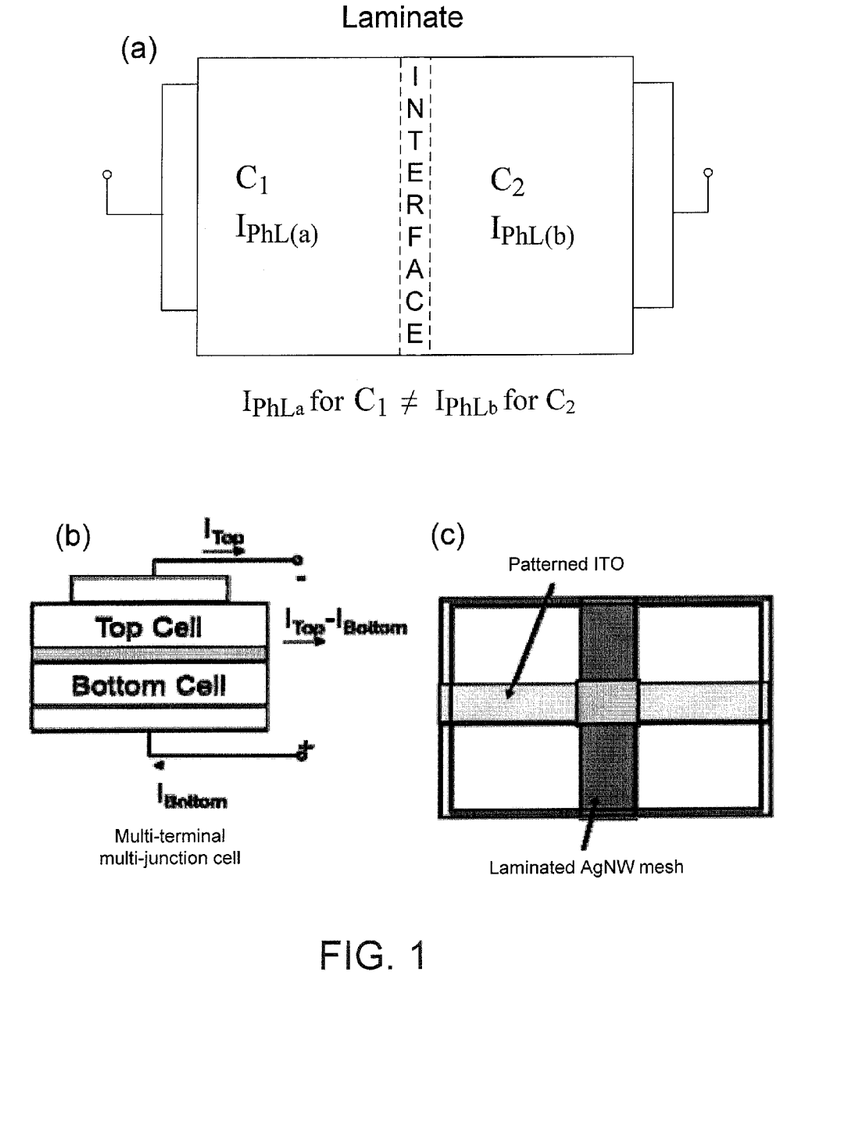
FIG. 1 shows the architecture and configuration of MJMT cells, consistent with one or more embodiments.

As illustrated in FIG. 1a in connection with one or more embodiments, series-connected multi junction multi-terminal cells are configured and arranged so as not to require that the photocurrent of each layer of cells in the stack be matched, with the overall current not being limited by that of the layer with the lowest photocurrent. This approach facilitates the construction of efficient multi junction multi-terminal cells. In addition, spectral variations over the course of a day or year are less likely to result in a drop in overall efficiency.

In various embodiments, a multi junction (MJ) architecture, in which intermediate electrodes or interface layer(s) are inserted between the layers of photovoltaic cells, is used to facilitate the production of different photocurrent and voltage in a layer of cells. For example, intermediate electrodes or interface layer(s) are configured such that current can be extracted from each layer of cells. In this case, the overall device efficiency is the sum of the efficiencies of the layers of cells and higher overall efficiencies are possible (e.g., when the choice of materials is limited). This architecture is referred herein as a multi junction multi-terminal (MJMT) architecture. For ease of reference, each layer of cells in the stack may be referred to as a subcell and such terms are used interchangeably herein.

FIG. 1b shows an example MJMT cell architecture as may correspond to one or more embodiments, in which excess current between adjacent subcells in the stack can be extracted through the intermediate electrode. In order to make use of the full solar spectrum, the intermediate electrode between the subcell layers has to be highly transparent. A schematic of the device configuration is depicted in FIG. 1c, in which indium-tin-oxide (ITO) is patterned into a strip and an Ag nanowire strip is laminated orthogonal to the ITO electrode. The top electrode is deposited through a shadow mask on top of the overlap area.

In certain embodiments, an MJMT architecture includes multiple transparent electrodes that act as intermediate electrodes. These intermediate electrodes are, at the same time, transparent to limit optical losses and conductive to limit resistive losses. These electrodes may also be implemented using a low-cost structure, such as for implementations involving multiple instances of the electrodes. In addition, for certain applications, the electrode is deposited without damage to the organic photovoltaic cell on which the electrode is formed. A transparent polymer cathode can be laminated on top of organic photovoltaic cells, but without significantly sacrificing device performance, e.g., due to the relatively low conductivity ($10^2$~$10^3$ S/cm) of the polymer layer.

Surprisingly, it has been demonstrated herewith (e.g., discovered) that solution-processed Ag (Ag) Nanowire percolating meshes have a figure of merit as a transparent conductor that is equal or better than that of sputter-coated ITO. With their potentially very low processing and materials cost, Ag nanowire transparent electrodes are useful for large-area applications and roll-to-roll processing. Semitransparent organic photovoltaic cells in which an Ag nanowire mesh electrode can be laminated on top of an organic photovoltaic cell to form a top transparent cathode contact. Accordingly, various aspects of the present disclosure are directed to a tandem MJMT organic photovoltaic cell with a laminated Ag nanowire intermediate electrode. In one implementation, the front cell has a polymer bulk heterojunction (BHJ) active layer with a power conversion efficiency of 2.6% while the back cell has a small-molecular weight active layer with a power conversion efficiency of 0.41% (after filtering of the incident light by the front cell), resulting in an overall conversion efficiency of 3.0%.

In one embodiment, photovoltaic cells are fabricated on substrates pre-coated with ITO that have been cleaned by sequential ultrasonic rinses in detergent solution and deionized water, boiled in trichloroethylene, rinsed in acetone, and finally boiled in 2-propanol. Donor substrates with Ag nanowire mesh films are prepared and patterned using a razor blade to define individual electrodes. The ITO layer on glass is patterned into individual electrodes using an HCl vapor etch. Semitransparent polymer cells are first deposited onto the patterned ITO after spincoating and annealing (150° C. for 20 min) a 0.2 wt % solution of Cs2CO3 in 2-ethoxyethanol to lower the work function. This is followed by spincoating a 2.5 wt % solution of poly(3-hexylthiophene) (P3HT) and [6,6]-phenyl C61-butyric acid methylester (PCBM) in dichlorobenzene. The polymer blend layer is allowed to dry slowly in a covered Petri dish and is annealed at 110° C. for 10 min to evaporate remaining solvent. A layer of Poly(3,4-ethylenedioxythiophene)poly(styrenesulfonate) (PEDOT: PSS, Clevios CPP 105D, H. C. Starck) is spun onto the blend and is annealed at 130° C. for 20 min to remove the solvent, similar to the approach discussed in Gaynor et al. (2010). The polymer front cells are retrieved from the glove box and the Ag nanowire mesh electrode is laminated onto the polymer layers under a pressure of $(1.4 \pm 0.6) \times 10^4$ psi for approximately 1 second in air. The Ag nanowire mesh adheres to the PEDOT:PSS layer and transfers from the donor substrate onto the front cell. The ITO and Ag nanowire electrode strips are arranged orthogonally and the resulting overlap area is the device area, as shown in FIG. 1c. Note that the lamination process removes the PEDOT:PSS layer from the BHJ layer where no Ag nanowire mesh is present. This is fortuitous in that it mitigates or prevents current collection through the PEDOT layer away from the defined cell area. The current density-voltage (JV) characteristics of the semitransparent polymer BHJ cells can be measured before they are loaded into a high vacuum chamber (~2×10-7 Torr base pressure), where a small-molecular weight back cell and metal cathode are deposited via thermal evaporation. The back subcell layer structure is Ag nanowire mesh/25 nm copper phthalocyanine (CuPc)/50 nm C60/10 nm bathocuproine (BCP)/100 nm Ag. The Ag top cathode is evaporated through a shadow mask arranged with respect to the bottom and intermediate electrode such that the back cell has an active area identical to that of the front cell, as shown in FIG. 1c.

Figure 2:
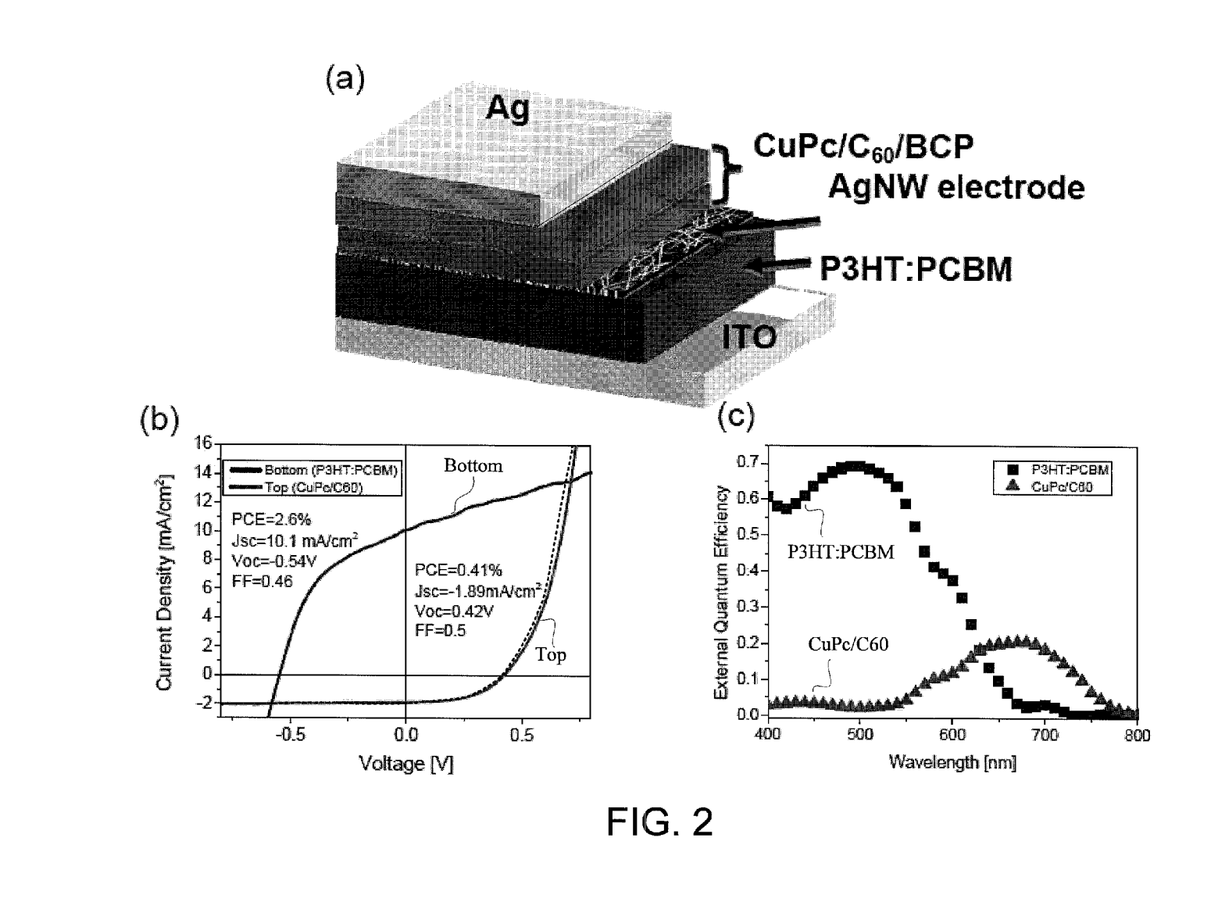
FIG. 2 shows a schematic of three-terminal two junction organic photovoltaic cell, current density vs. applied voltage characteristic, and modeled external quantum efficiencies (EQE) of the cell, consistent with one or more embodiments.

FIG. 2 shows the structure and modeled performance of one MJMT cell implementation in accordance with one or more embodiments. FIG. 2a shows a schematic of three-terminal two junction organic photovoltaic cell. The structure is glass/ITO/P3HT:PCBM/AgNWs/CuPc/C60/BCP/Ag. FIG. 2b shows current density vs. applied voltage characteristics for both top and bottom cells. The front cell has a polymer bulk heterojunction (BHJ) active layer with a power conversion efficiency of 2.6% while the back cell has a small-molecular weight active layer with a power conversion efficiency of 0.41%, resulting in an overall conversion efficiency of 3.0%. FIG. 2c shows modeled external quantum efficiencies (EQE) of the front (squares) and back cell (triangles) of the MJMT cell. Exciton diffusion lengths of 7 nm for CuPc and 15 nm for C60 are assumed. For the P3HT:PCBM BHJ cell, internal quantum efficiency (IQE) of 80% is assumed.

The current density-voltage characteristics of an example embodiment including a polymer front and small molecule back cell as measured under 100 mW/cm$^2$ AM1.5 illumination are shown in FIG. 2b. The polymer front cell has a short circuit current density ($J_{SC}$) of 10.1 mA/cm$^2$, an open circuit voltage ($V_{OC}$) of 0.54V, a fill factor (FF) of 0.46, and a power conversion efficiency (PCE) of 2.6%, while for the small-molecular weight back cell $J_{SC}$=1.89 mA/cm$^2$, $V_{OC}$=0.42V, FF=0.50, and PCE=0.41%.

Optical and exciton diffusion modeling can be used to calculate the expected external quantum efficiency (EQE) and $J_{SC}$ for the subcells in this MJMT stack. Exciton diffusion lengths of 7 nm for CuPc and 15 nm for C$_{60}$ can be assumed, and an internal quantum efficiency (IQE) of 80% for the P3HT:PCBM BHJ cell can be assumed. The modeled EQE of the front (squares) and back cell (triangles) are shown in FIG. 2c. The modeled photocurrents (front cell: 7.7 mA/cm$^2$, back cell: 2.1 mA/cm$^2$) are in reasonable agreement with the experimental results of FIG. 2b (front cell: 10.1 mA/cm$^2$, back cell: 1.89 mA/cm$^2$).

The above experimental/detailed-embodiment MJMT cell demonstrates MJMT operation in which the individual efficiencies can be added to obtain an overall efficiency without necessarily requiring photocurrent matching. In some embodiments, this is practically done in a module as discussed below. To determine the efficiency potential of the MJMT architecture and compare it to that of the series-connected MJ architecture, an optimized two-cell MJMT cell is modeled and a three-cell series-connected MJ cell is optimized. Assuming that for each subcell layer $qV_{OC}$=HOMO$_{Donor}$−LUMO$_{Acceptor}$−0.3 eV, the IQE and FF of all cells is 85%, and 65%, respectively. Both cell architectures were optimized by scanning a library of small-molecular weight materials and material sequences, and by optimizing optical interference for each combination to maximize the overall PCE.

Figure 3A:
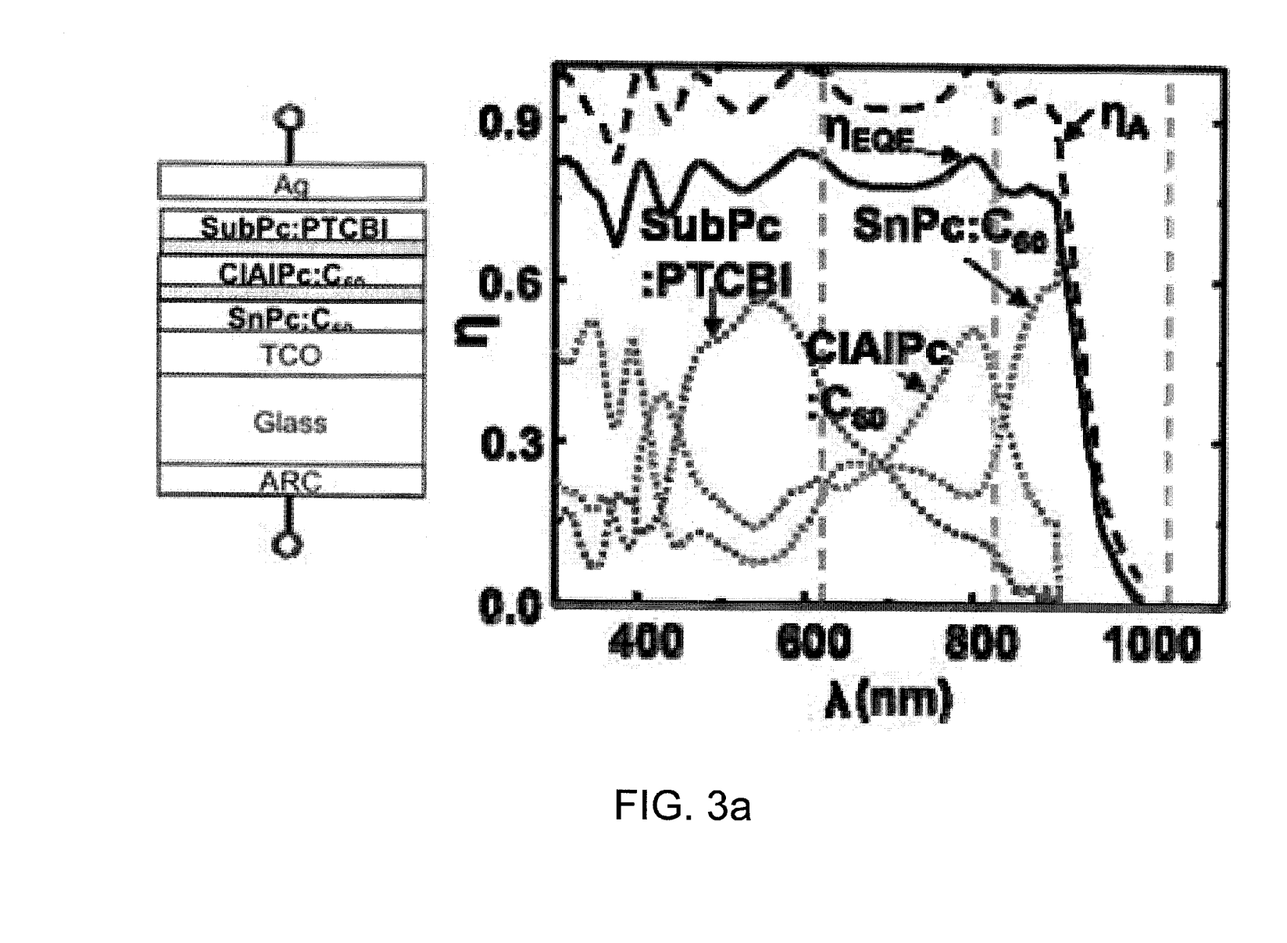
FIG. 3 shows three-cell series-connected MJ cell and a two-cell MJMT cell architectures, as well as optical absorption, external quantum efficiency, and power conversion efficiency plots of the cell structures.
Figure 3B:
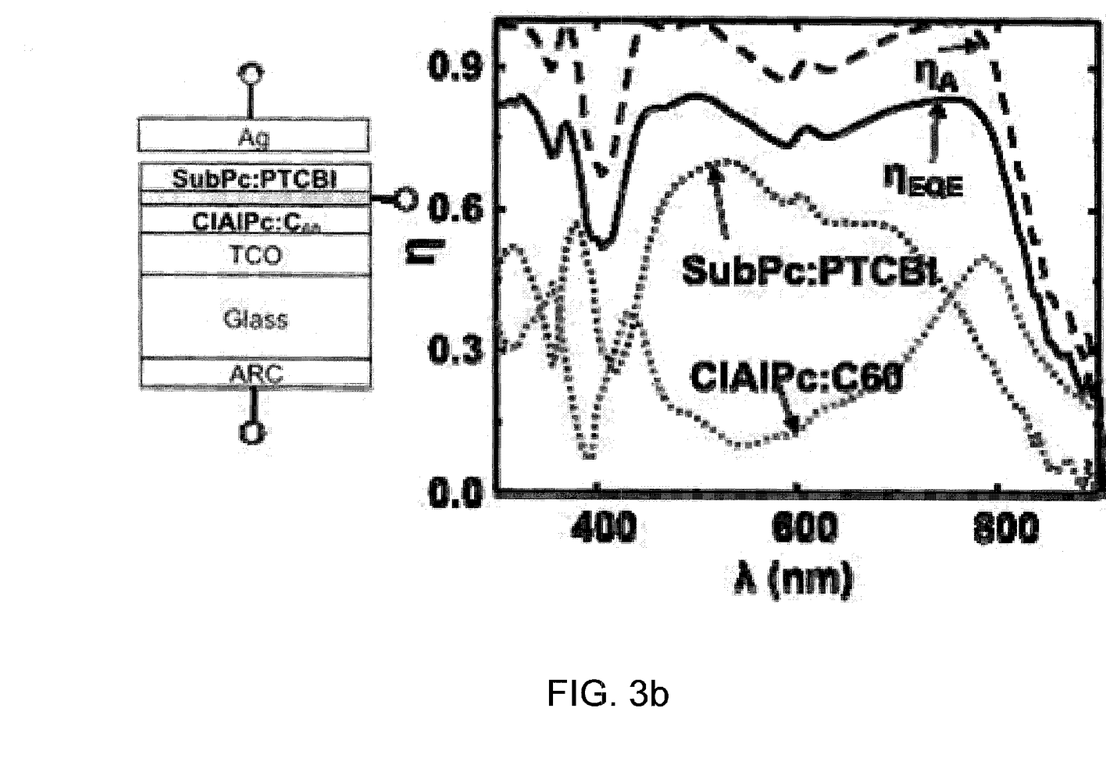
Figure 3C:
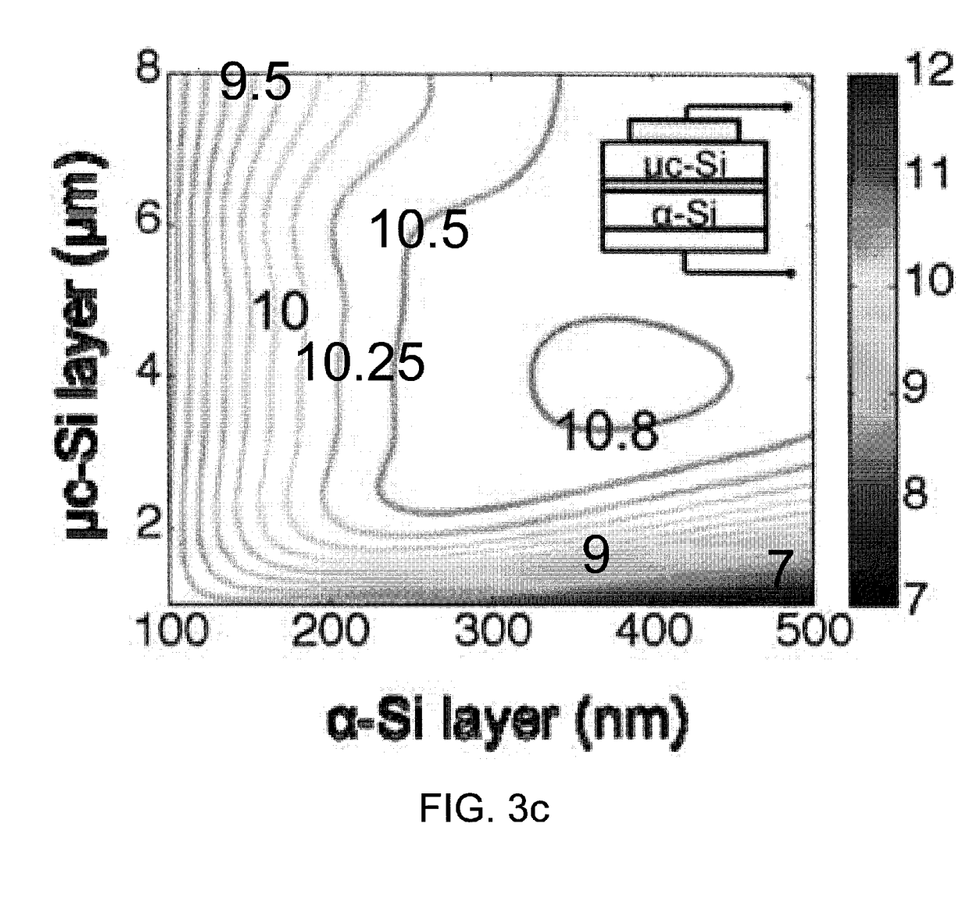
Figure 3D:
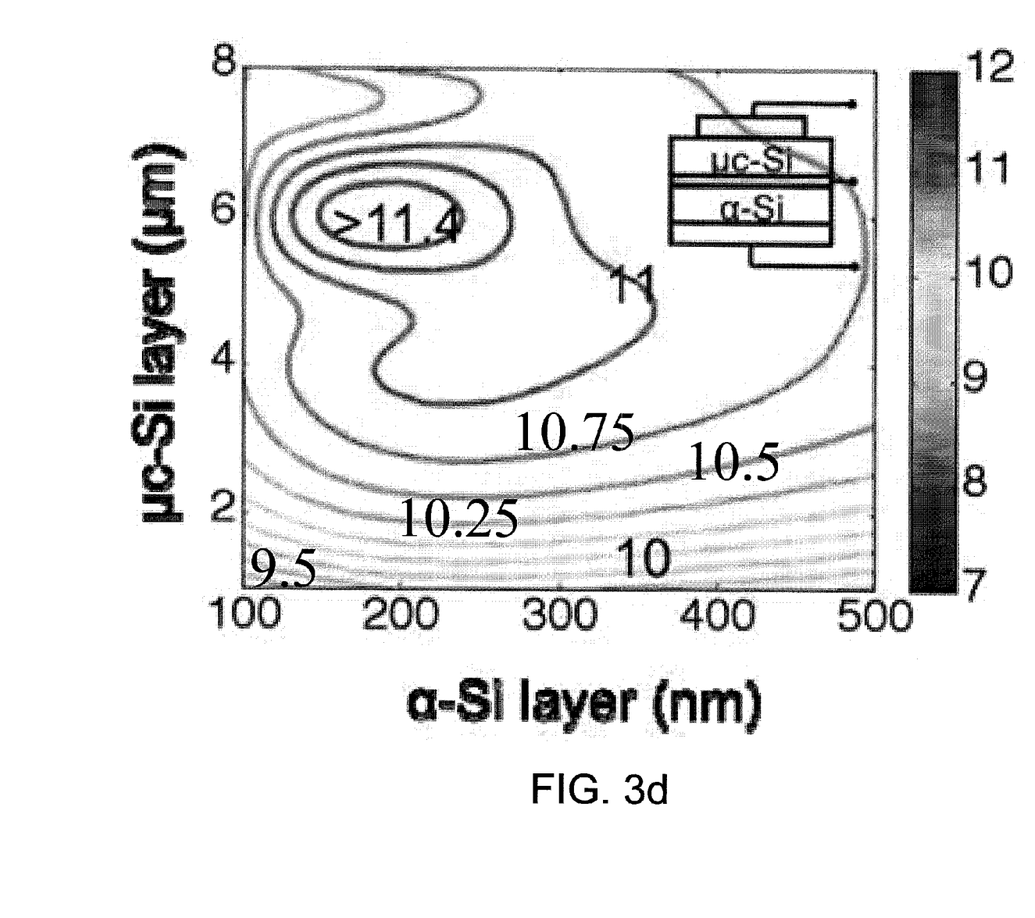

FIG. 3 shows the structure and efficiency of a MJ cell configuration and MJMT cell configuration, with one or more embodiments applicable to implementation in connection with the structures and characteristics represented therein (e.g., in one or more of FIGS. 3a, 3b, 3c and 3d). FIG. 3a shows a three-cell series connected MJ cell. FIG. 3b shows a two-cell MJMT cell architecture. Optical absorption and external quantum efficiency plots of optimized cell structures are shown. An optimized three-cell series-connected MJ cell results in a PCE of 11.2% while optimized two-cell MJMT architecture results in a PCE of 12.3%. FIG. 3c shows a power conversion efficiency map as functions of both α-Si and μc-Si layer thicknesses for a conventional series-connected tandem, with exemplary values shown for respective line-based regions. FIG. 3d shows a power conversion efficiency map as functions of both α-Si and μc-Si layer thicknesses for a MJMT tandem, also with exemplary values shown for respective line-based regions. Note that the MJMT tandem has a much thinner optimal α-Si layer, which will reduce the Staebler-Wronski effect significantly, improving the stability of the cells.

A three-cell series-connected MJ cell (FIG. 3a) may exhibit a PCE of 11.2% and a photocurrent of $J_{SC}$=9.1 mA/cm². Despite using three subcell layers, the efficiency of this 3-cell series-connected MJMT stack can be otherwise limited because of a current-matching constraint as discussed above, which is difficult in the face of a substantial overlap in the absorption spectra of the cells. Various embodiments are directed to a structure as shown in FIG. 3a with mitigation of such current-matching constraints as discussed herein. FIG. 3b shows an MJMT architecture with two subcell layers and exhibiting a PCE of 12.3%. The model predicts for the bottom chloroaluminum phthalocyanine (ClAlPc):$C_{60}$ subcell layer of the MJMT stack that $J_{SC}$=8.45 mA/cm² and $V_{OC}$=0.6V and for the subphthalocyanine (SubPc):3,4,9,10-perylene tetracarboxylic bis(benzimidazole) (PTCBI) top cell that $J_{SC}$=15.41 mA/cm² and $V_{OC}$=0.9V. The MJMT architecture can be applied to multi junction cells in other material systems such as amorphous Si/microcrystalline Si (α-Si/μc-Si) tandem cells.

AMPS-1D is used to model both a series-connected and multi-terminal α-Si/μc-Si tandem. The bandgap energy of one layer of cells is set to 0.01 eV while the optical constants remained intact to estimate the current of the other layer. Both the α-Si and μc-Si cell are modeled as p-i-n structures. When current-matching is required, a maximum efficiency of 10.8% for a 400 nm-thick α-Si layer and 4 μm-thick μc-Si layer can be obtained. In FIG. 3c, the overall power conversion efficiency for the series-connected multi junction cell is plotted as a function of the thickness of both layers of cells. The MJMT architecture results in a higher maximum efficiency of 11.6% for a 200 nm-thick α-Si layer and 6 μm-thick μc-Si layer, as shown in FIG. 3d. Optimized MJMT stacks have much thinner α-Si layers compared to optimized series-connected multi junction cells. The use of thinner α-Si layers of cells is beneficial as it can reduce the Staebler-Wronski effect significantly, and therefore contribute to the stability of the cells.

In certain implementations, both electrodes of each layer of cells in a MJMT architecture are isolated from those of other layers of cells to allow for series-connections between cells in a module. For example, in a two layer stack MJMT, a four-terminal MJ cell allows for a module architecture in which the font cells of adjacent cells are series-connected to result in a module voltage $V_m$. The same is done for the back cells, but at a different pitch such that the voltage adds up $V_m$ as well.

Figure 4:
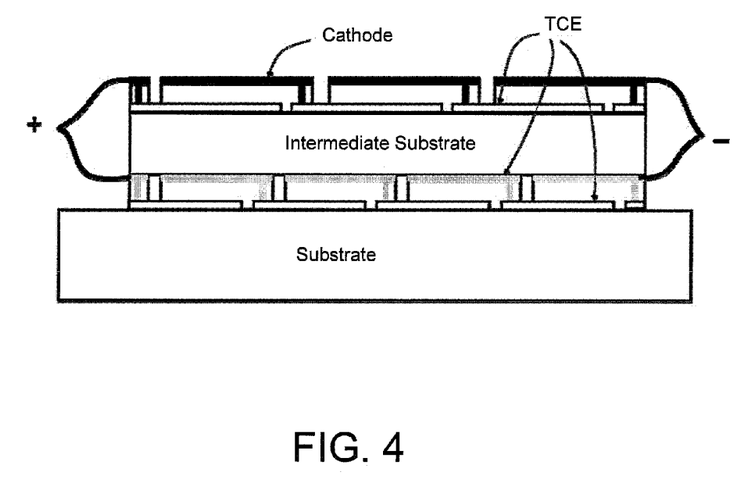
FIG. 4 shows a four-terminal MJ cell architecture with two subcells, consistent with one or more embodiments.

As shown in FIG. 4, these above-discussed aspects can be readily implemented via a four-terminal MJ cell architecture with two layers of cells. If the voltage ratio of each subcell of top and bottom is 4:3, then the pitch ratio of the subcell can be 3:4 to match the overall output voltages of both top and bottom cell arrays. The result is a two-terminal module implementing MJMT photovoltaic cells without current or voltage matching requirements.

In certain of the above embodiments, the organic MJMT solar cell is realized by laminating an Ag nanowire intermediate electrode onto the front cell. The MJMT architecture can be implemented without voltage or current matching and as a result, offers flexibility in cell design. Using model simulations, the MJMT architecture shows higher achievable efficiencies with fewer subcells (e.g., compared to the series-connected MJ cell architecture).

Other embodiments disclosed herein are directed to certain types of devices having multi-terminal multi-junction organic photovoltaic cells that use a relatively low-cost, high-performance metal nanowire mesh as an intermediate electrode. As examples of such mesh-type materials useful for this construction and architecture, reference may be made to the meshes illustrated and described herein below.

Further aspects of the present disclosure relate to parallel tandem cells and details relating thereto can be combined with the above-discussed aspects of the disclosure. Multi-junction cells with more than three terminals can be constructed using Ag nanowire meshes (as described above, e.g., with FIG. 1a) where the intermediate region or electrode can function to remove current for the mismatched-cell condition.

Figure 5:
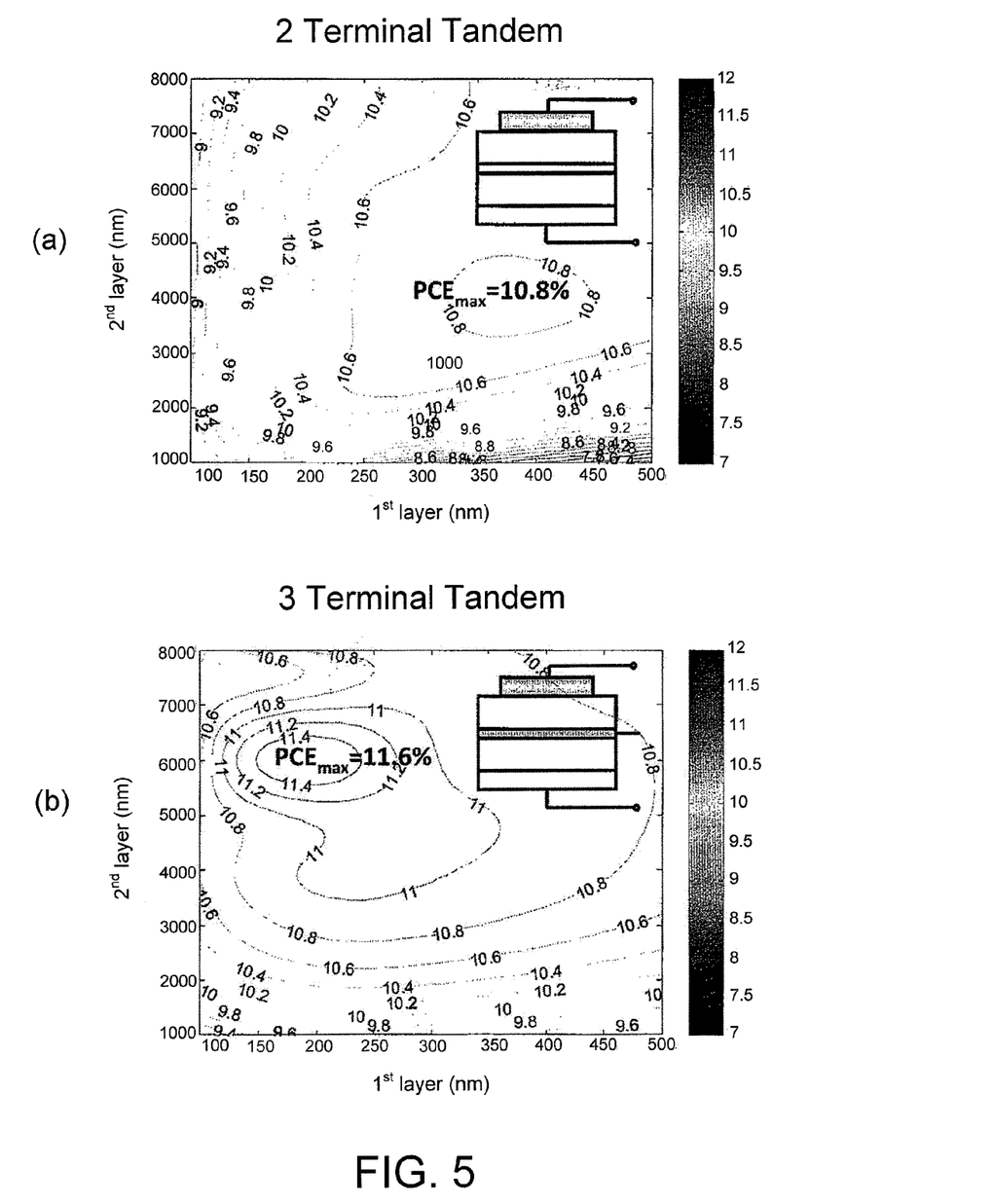
FIG. 5 shows the efficiency plots of two —Si:H/mc-Si:H tandem cells, one cell with two terminals and the other cell with three terminals, consistent with one or more embodiments.

As an experimental example, Ag (or Ag-based) nanowire meshes can be implemented as intermediate electrodes, and the intermediate electrodes can mitigage/remove current matching conditions, which can make it difficult for two terminal multi junction cells to be optimized. Each multi junction cell with only two terminals can produce an equal amount of current in order to achieve highest power conversion efficiency. On the other hand, if there are electrodes other than top and bottom ones, current difference can be flowing through those additional electrodes. As such, electrical isolation between each cell allows for more focus on optical optimization in order to make full use of solar spectrum. For example, in the case of α-Si:H/mc-Si:H tandem cells, efficiency improves by about 1% by inserting intermediate electrode (FIG. 5). Moreover, optimized thickness allows a-Si:H to be thinner, which is beneficial because thick a-Si:H suffer from Staebler-Wronski effect.

Multi-junction cells having sub-cells with the same (or similar) material are also realized through various embodiments. For example, in the case that a light trapping effect is stronger near a textured surface, a segment near the textured surface can be used to produce different current than the rest. In such cases, multi junction structures can be beneficial.

Parallel tandem cells can be beneficial in terms of angular response as well. Even if one optimizes series tandem cell for each cell to produce the same current for a certain incident angle, its efficiency may deteriorate at other angles due to current mismatch since each cell responds differently to sun spectrum.

Figure 6:
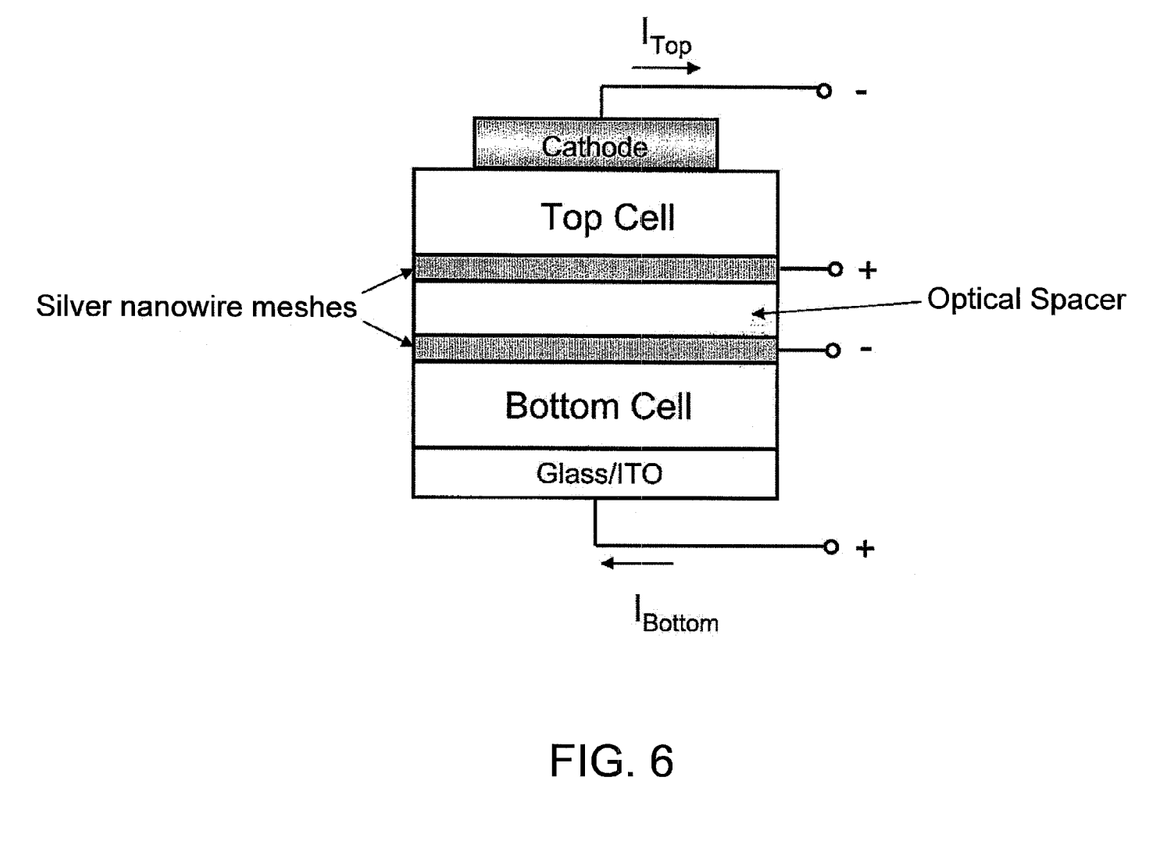
FIG. 6 shows a four-terminal configuration with two stacked cells, consistent with one or more embodiments.

In the case of two stacked cells, a four terminal configuration can make cells electrically isolated and therefore wiring can be much easier (as shown in FIG. 6). Optical spacers can be inserted between top and bottom cells, and may include materials such as PET, PDMS, and others. In some implementations, the bottom and top cells can be wired independently.

One or more embodiments are directed to a method for depositing transparent conductive film on an organic photovoltaic cell without causing significant damage to the cell. In some embodiments nanowire meshes are configured and arranged as electrodes between stacked photovoltaic cells. For example, Ag nanowires may be arranged to provide good conductive for the electrode while holes in the arrangement of nanowires allows for passing of light. For Ag nanowire meshes, for example, the meshes can be deposited via either wet-coating (such as drop casting, spin coating, spray coating, etc.) or dry-coating (such as lamination, etc.). As for wet-coating, Ag nanowire meshes can be deposited more uniformly onto a hydrophilic surface than a hydrophobic one. In some embodiments, substrates are rendered hydrophilic before casting Ag nanowires on them, to mitigate Ag nanowire aggregation as may be present on hydrophobic substrates. In certain embodiments, Ag nanowires are applied in suspension in methanol or isopropyl alcohol, with methanol enhancing Ag nanowire mesh uniformity (e.g., relative to isopropyl alcohol). Substrates may be washed/treated with methanol before casting Ag nanowire suspension, to mitigate Ag nanowire mesh aggregation.

Figure 7:
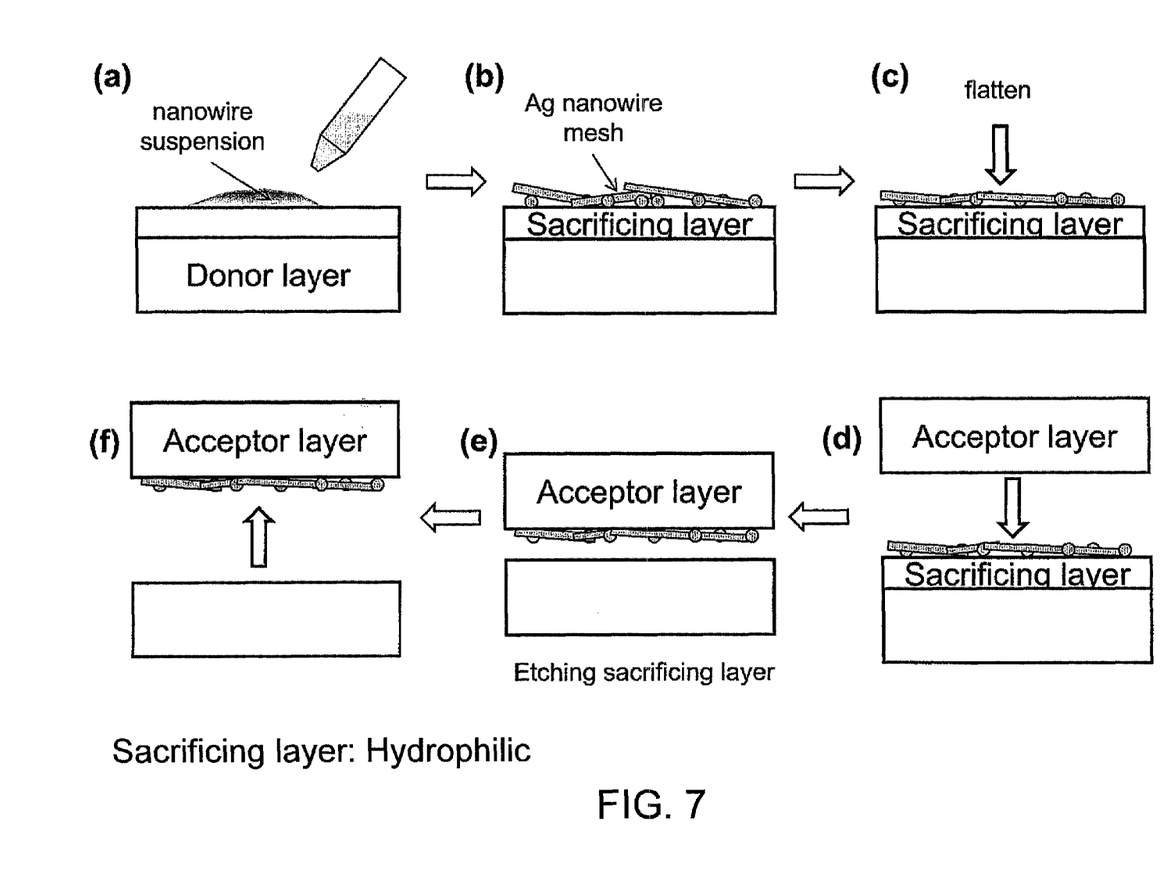
FIG. 7 shows an example technique of spray coating for mass production and improved uniformity, consistent with one or more embodiments.

FIG. 7 shows a process for forming a transparent conductive film including a nanowire mesh that can be transferred after formation of the film from a carrier substrate to a target device (e.g., an organic photovoltaic cell), in accordance with one or more embodiments. FIG. 7a illustrates deposition of Ag nanowires suspended in a solution onto a sacrificial layer that is formed on a substrate. The sacrificial layer is formed of a material such as hydrophilic ITO that may be dissolved or etched in a later step. The nanowire solution is evaporated as shown in FIG. 7b to produce a nanowire mesh. In some embodiments, the surface of the sacrificial layer is coated with poly L-lysine prior to depositing the solution. The affinity of the Ag nanowires for poly-L-lysine, helps to prevent the nanowires from aggregating while the solution dries on the substrate.

The meshes are subsequently heated, (e.g., heated in an oven to 180° C. for 20 min) to sinter nanowires together at crossing points in the mesh. In some embodiments, the resulting Ag meshes may be relatively rough with nanowire protrusions as high as 200-300 nm, and may be too rough for use in many organic photovoltaic cells. To lower the surface roughness, one or more embodiments may subject the nanowire mesh to uniaxial pressure applied via a clean glass substrate and hydraulic press to substantially flatten the features. An example flattened nanowire mesh is shown in FIG. 7c. In some embodiments, the Ag nanowire mesh may optionally be patterned using a razor blade or etch to define the pattern of the nanowire mesh electrode.

FIG. 7d shows the Ag nanowire mesh being laminated onto an acceptor layer (e.g., an organic photovoltaic cell). For instance, in one embodiment, the nanowire mesh is affixed to the acceptor layer by applying a uniaxial pressure of $(1.4+-0.6) \times 10^4$ psi.

The donor layer may be removed by dissolving or etching the sacrificial layer as shown in FIG. 7e. The accepting layer can be implemented with a material that is not dissolvable by the solution used to dissolve the sacrificial layer. In one embodiment in which a hydrophilic material is used as the sacrificial layer, the acceptor layer is a hydrophobic material. This process leads to a complete transfer of the patterned Ag nanowire mesh from the donor glass substrate to the accepting organic solar cell as shown in FIG. 7f.

Figure 8:
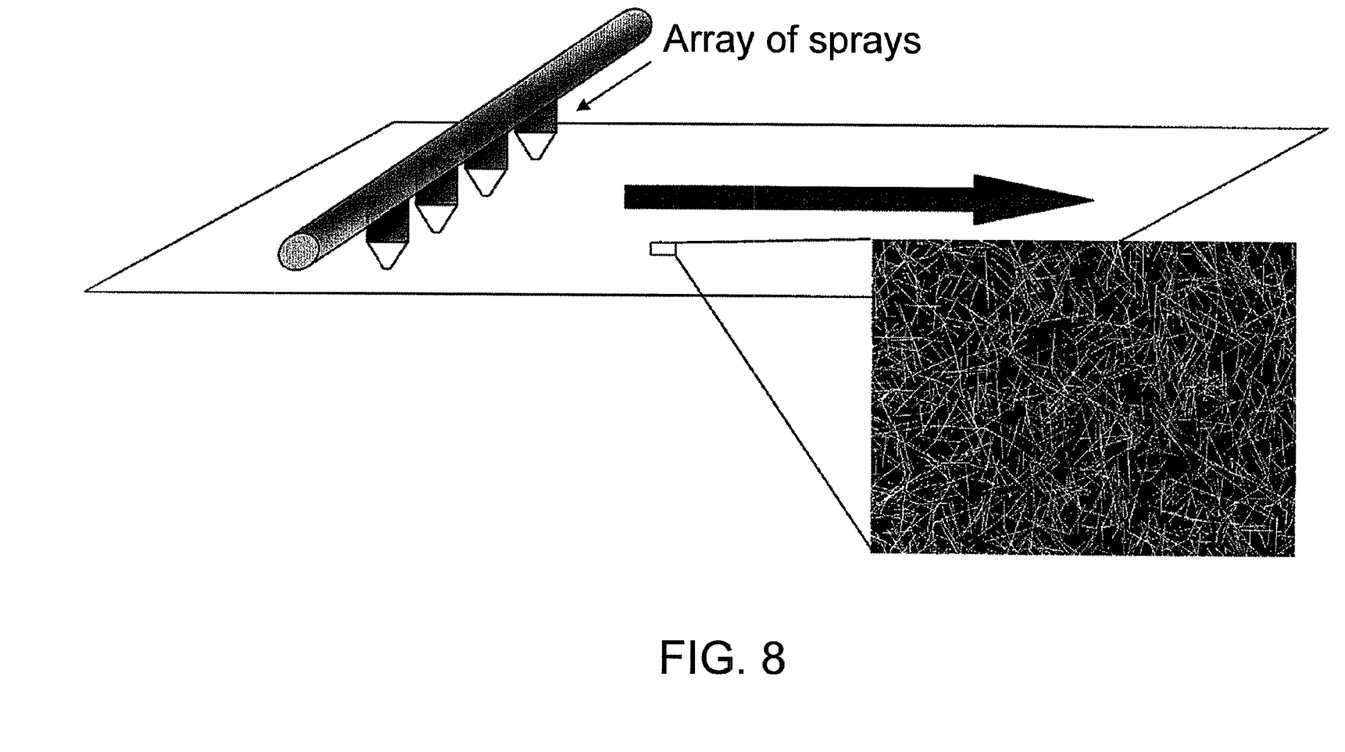
FIG. 8 shows a procedure that may be used to deposit Ag nanowire meshes onto hydrophobic substrates, consistent with one or more embodiments.

For mass production and uniformity, spray coating may be implemented as shown in FIG. 8. Silver nanowires can stick to substrates in either wet or dry conditions. In certain embodiments, humidity is controlled (e.g., raised) to control uniformity of the nanowires.

Figure 9:
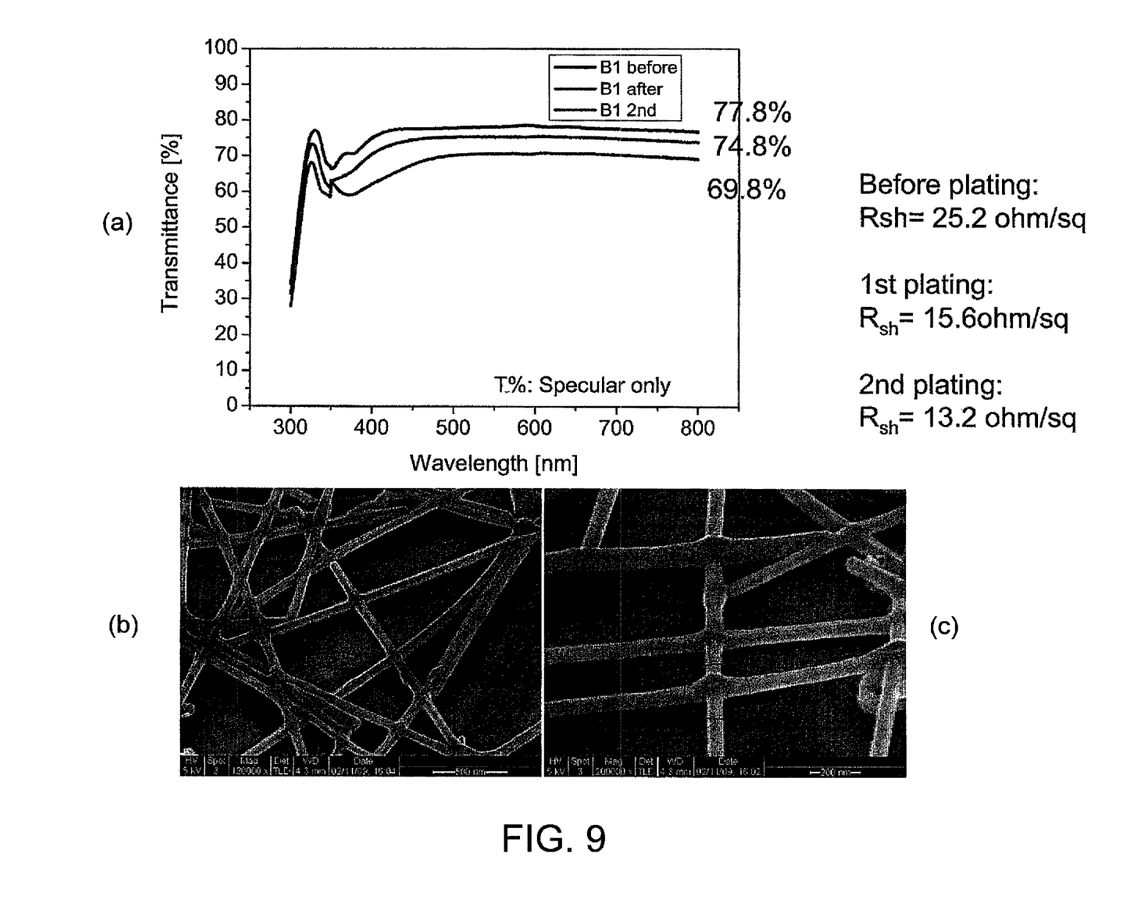
FIG. 9 shows effects of electro/electroless-plating onto Ag nanowire meshes on sheet resistance and transmittance, consistent with one or more embodiments.

In some embodiments, electro/electroless-plating is used for plating onto Ag nanowire meshes so as to reduce sheet resistance without significant reduction of transmittance by coating the surface of meshes. An example of such an approach is illustrated in FIG. 9. Plating reduces nanowire resistance and contact resistance between nanowires at the same time. For example, when the Ag nanowire meshes are plated in Ag electrolyte solution, sheet resistance drops from 25.2 ohm/sq to 15.6 phm/sq, while specular solar transmissivity drops only 3%, from 77.8% to 74.8%. Another plating reduces the sheet resistance to 13.2 ohm/sq with 69.8% specular solar transmissivity. Sheet resistance of a Ag nanowire network, which can be limited by contact resistances at junctions between wires, is reduced via plating by wrapping the junction areas (see circle in SEM image, FIG. 9).

Silver nanowire meshes scatter incoming light throughout cells, and therefore they can induce a light-trapping effect as well. In addition to Ag nanowire meshes, some other non-absorbing nanoparticles (i.e., $SiO_2/ZnO$ nanoparticles) can be incorporated in order to boost a light-trapping effect.

Other types of metal meshes can be constructed in accordance with various embodiments. In one embodiment, target material is deposited on a substrate, and Ag nanowires (and/or other types of nanowires) are deposited on the substrate. The target material is etched by directional etching, so that one can have the same pattern as overlying nanowires, and the target material's top surface is at the same height.

One or more embodiments may be applicable to a variety of applications and structures utilizing transparent conductive electrodes. Various embodiments described above, may be implemented together and/or in other manners. One or more of the aspects described in the present disclosure can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the embodiments.

Unless specifically stated otherwise, it is appreciated that discussions utilizing terms such as "matching" or "processing" or "computing" or "determining" or "displaying" or the like, refer to the action and processes of automatic equipment (such as manufacturing equipment) and/or logic circuit (such as a computer system, combinational and/or sequential electronic logic circuitry, a configurable or programmable circuit or a similar electronic computing device) that manipulates and transforms the materials or data represented as physical (electronic) aspects or quantities within the equipment's components or in the case of circuit-based system or devices (such as memories, registers or other such information storage, transmission, display devices, or the like). As indicated in the examples provided above, such material or data is transformed for the purpose of changing the related representations of the physical aspects or quantities.

What is claimed is:

1. A method of forming transparent electrodes on organic photovoltaic cells, the method comprising:
    forming a layer of dissolvable material on a substrate;
    depositing conductive nanowires suspended in a solution on the layer of dissolvable material;
    evaporating the solution to form a nanowire mesh;
    heating the nanowire mesh to join junctions where nanowires cross in the nanowire mesh;
    affixing the nanowire mesh on a layer of one or more organic photovoltaic cells; and
    dissolving the layer of dissolvable material, the nanowire mesh forming a transparent electrode on the layer of one or more organic photovoltaic cells.

2. The method of claim 1, further comprising depositing another layer of one or more organic photovoltaic cells over the nanowire mesh to form a stack of the respective layers of one or more photovoltaic cells with the nanowire mesh in between.

3. The method of claim 1, wherein the conductive nanowires are silver.

4. The method of claim 1, wherein the conductive nanowires of the solution are suspended in methanol.

5. The method of claim 1, wherein the one or more organic photovoltaic cells of the layer are coupled in series.

6. The method of claim 1, further including affixing to the nanowire mesh another layer of one or more organic photovoltaic cells, wherein the layers of one or more organic photovoltaic cells are respectively configured to absorb light of different spectral frequencies.

7. The method of claim 1, further including affixing to the nanowire mesh a plurality of layers of one or more organic photovoltaic cells wherein the layers of one or more organic photovoltaic cells have respectively different photocurrent densities whereby each different photocurrent density is different than the photocurrent densities of each of the other plurality of photovoltaic layers.

8. The method of claim 1, further comprising: compressing the nanowire mesh between the substrate and a plate to reduce roughness of the nanowire mesh.

9. The method of claim 2, wherein depositing the other layer includes:
- depositing a transparent insulating layer on the nanowire mesh;
- depositing a second nanowire mesh on the transparent insulating layer; and
- depositing the second organic photovoltaic cell on the second nanowire mesh.

10. The method of claim 1, further comprising plating the nanowire mesh in a silver electrolyte solution.

11. The method of claim 1, further comprising flattening the nanowire mesh.

12. The method of claim 11, wherein flattening includes applying uniaxial pressure via a clean glass substrate and hydraulic press to the nanowire mesh.

13. The method of claim 1, wherein the solution is configured and arranged to, in response to evaporation of solvent in the solution, form the mesh of nanowires on a sacrificial material.

14. The method of claim 1, wherein the solution is configured and arranged to, in response to evaporation of solvent in the solution, form the mesh of nanowires on a sacrificial material, and wherein the sacrificial material is provided on the mesh of nanowires and wherein the substrate is affixed to the sacrificial material.

15. The method of claim 1, further comprising using a solution of silver nanowires to form a mesh of nanowires on a sacrificial material, and wherein the sacrificial material is dissolvable to produce a mesh of silver nanowires on the layer of one or more organic photovoltaic cells.

16. The method of claim 1, further comprising using a solution of silver nanowires to form a mesh of nanowires, and wherein the sacrificial material is dissolvable to produce a mesh of silver nanowires on the layer of one or more organic photovoltaic cells, and wherein the mesh of silver nanowires are semitransparent, having a transmissivity greater than 75%.

17. The method of claim 1, further comprising using a solution of silver nanowires to form a mesh of silver nanowires, wherein the mesh of silver nanowires are flattened so that the nanowires protrude from the mesh no more than a thickness of the layer of one or more organic photovoltaic cells.

* * * * *